(12) United States Patent
Watanabe et al.

(10) Patent No.: US 11,218,656 B2
(45) Date of Patent: Jan. 4, 2022

(54) SOLID-STATE IMAGING DEVICE AND ELECTRONIC APPARATUS

(71) Applicant: SONY CORPORATION, Tokyo (JP)

(72) Inventors: Taiichiro Watanabe, Kanagawa (JP); Fumihiko Koga, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/944,732

(22) Filed: Jul. 31, 2020

(65) Prior Publication Data

US 2020/0366859 A1 Nov. 19, 2020

Related U.S. Application Data

(63) Continuation of application No. 16/086,312, filed as application No. PCT/JP2017/010864 on Mar. 17, 2017, now Pat. No. 10,764,523.

(30) Foreign Application Priority Data

Mar. 31, 2016 (JP) .................................. 2016-070059

(51) Int. Cl.
  *H04N 5/369* (2011.01)
  *H04N 5/374* (2011.01)
  (Continued)

(52) U.S. Cl.
  CPC ... *H04N 5/36963* (2018.08); *H01L 27/14605* (2013.01); *H01L 27/14607* (2013.01);
  (Continued)

(58) Field of Classification Search
  CPC .................................................. H04N 5/36963
  (Continued)

(56) References Cited

U.S. PATENT DOCUMENTS

2006/0262209 A1    11/2006   Kishi
2011/0149137 A1*    6/2011   Koike ............... H01L 27/14603
                                                                348/308
(Continued)

FOREIGN PATENT DOCUMENTS

CN          104396018 A    3/2015
JP          2006-222751 A   8/2006
(Continued)

OTHER PUBLICATIONS

International Search Report and Written Opinion of PCT Application No. PCT/JP2017/010864, dated May 23, 2017, 12 pages of English Translation and 10 pages of ISRWO.

(Continued)

*Primary Examiner* — Joel W Fosselman
(74) *Attorney, Agent, or Firm* — Chip Law Group

(57) ABSTRACT

A solid-state imaging device that is one aspect of the present disclosure has a first photoelectric conversion portion, an upper electrode, and a lower electrode formed outside a substrate, the first photoelectric conversion portion performing photoelectric conversion in accordance with incident light, the upper electrode and the lower electrode being formed to sandwich the first photoelectric conversion portion. The solid-state imaging device includes an aperture pixel that is disposed on a pixel array, and generates a normal pixel signal; an OPB pixel that is disposed at an end portion on the pixel array, and generates a pixel signal indicating a dark current component; and a charge releasing portion that is disposed between the aperture pixel and the OPB pixel, and releases electric charge flowing out from the aperture pixel.

16 Claims, 13 Drawing Sheets

(51) Int. Cl.
*H01L 27/146* (2006.01)
*H04N 5/359* (2011.01)

(52) U.S. Cl.
CPC .. *H01L 27/14623* (2013.01); *H01L 27/14643* (2013.01); *H01L 27/14665* (2013.01); *H04N 5/3591* (2013.01); *H04N 5/369* (2013.01); *H04N 5/374* (2013.01); *H01L 27/1464* (2013.01)

(58) Field of Classification Search
USPC .......................................................... 348/294
See application file for complete search history.

(56) References Cited

U.S. PATENT DOCUMENTS

| | | | |
|---|---|---|---|
| 2012/0086095 | A1 | 4/2012 | Hiroshi et al. |
| 2013/0076951 | A1* | 3/2013 | Endo ................. H01L 27/14689 348/308 |
| 2015/0001503 | A1 | 1/2015 | Hirose |
| 2015/0097966 | A1 | 4/2015 | Nishiyama |
| 2015/0194469 | A1 | 7/2015 | Joei |
| 2016/0190211 | A1 | 6/2016 | Joei |
| 2016/0249000 | A1 | 8/2016 | Esumi |

FOREIGN PATENT DOCUMENTS

| | | |
|---|---|---|
| JP | 2008-103472 A | 5/2008 |
| JP | 2011-151461 A | 8/2011 |
| JP | 5547717 B2 | 7/2014 |
| JP | 2014-195296 A | 10/2014 |
| JP | 2016-067034 A | 4/2016 |
| JP | 2017-059855 A | 3/2017 |
| TW | 201403804 A | 1/2014 |
| WO | 2010/116974 A1 | 10/2010 |
| WO | 2014/007132 A1 | 1/2014 |

OTHER PUBLICATIONS

International Preliminary Report on Patentability of PCT Application No. PCT/JP2017/010864, dated Oct. 11, 2018, 13 pages of English Translation and 07 pages of IPRP.
Non-Final Office Action for U.S. Appl. No. 16/086,312, dated Jan. 14, 2020, 09 pages.
Notice of Allowance for U.S. Appl. No. 16/086,312, dated May 1, 2020, 08 pages.

* cited by examiner

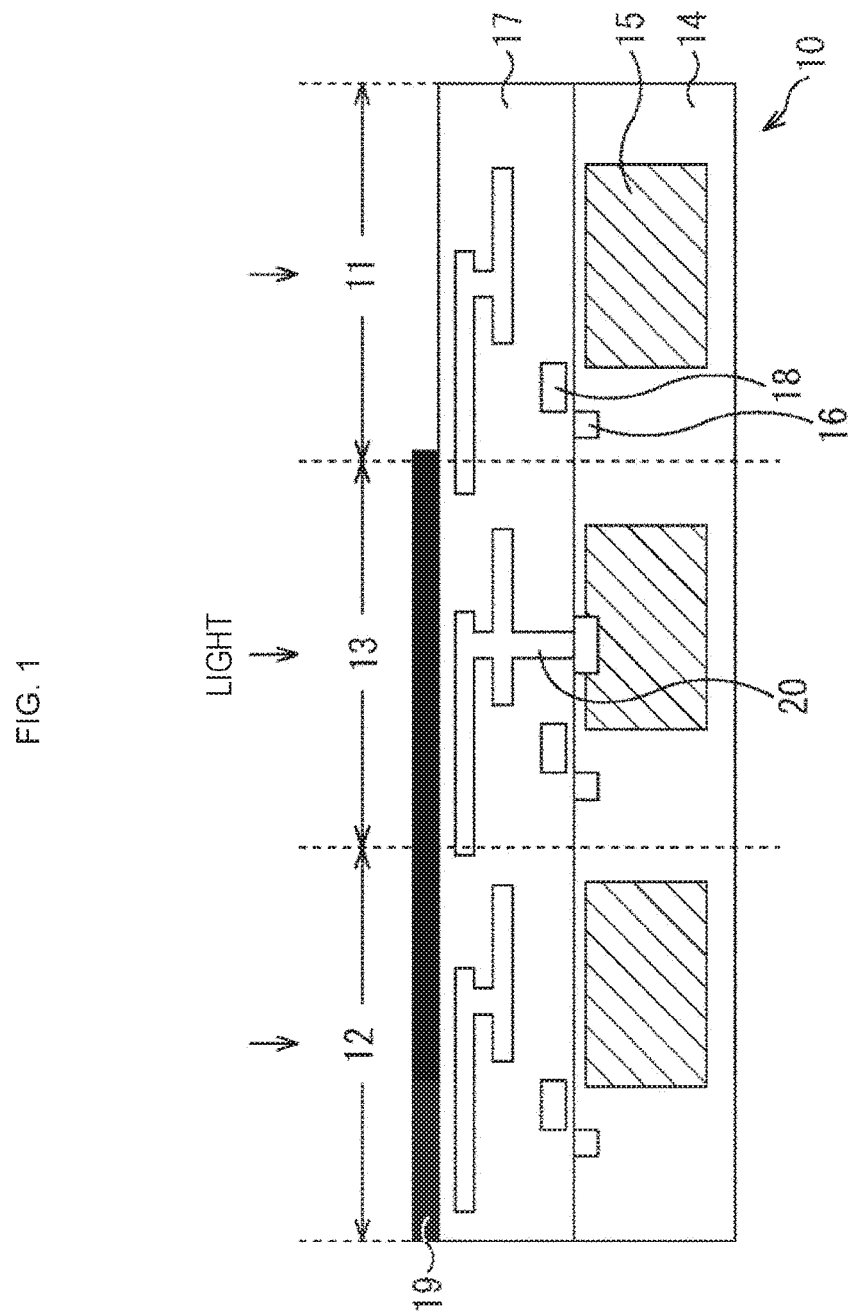

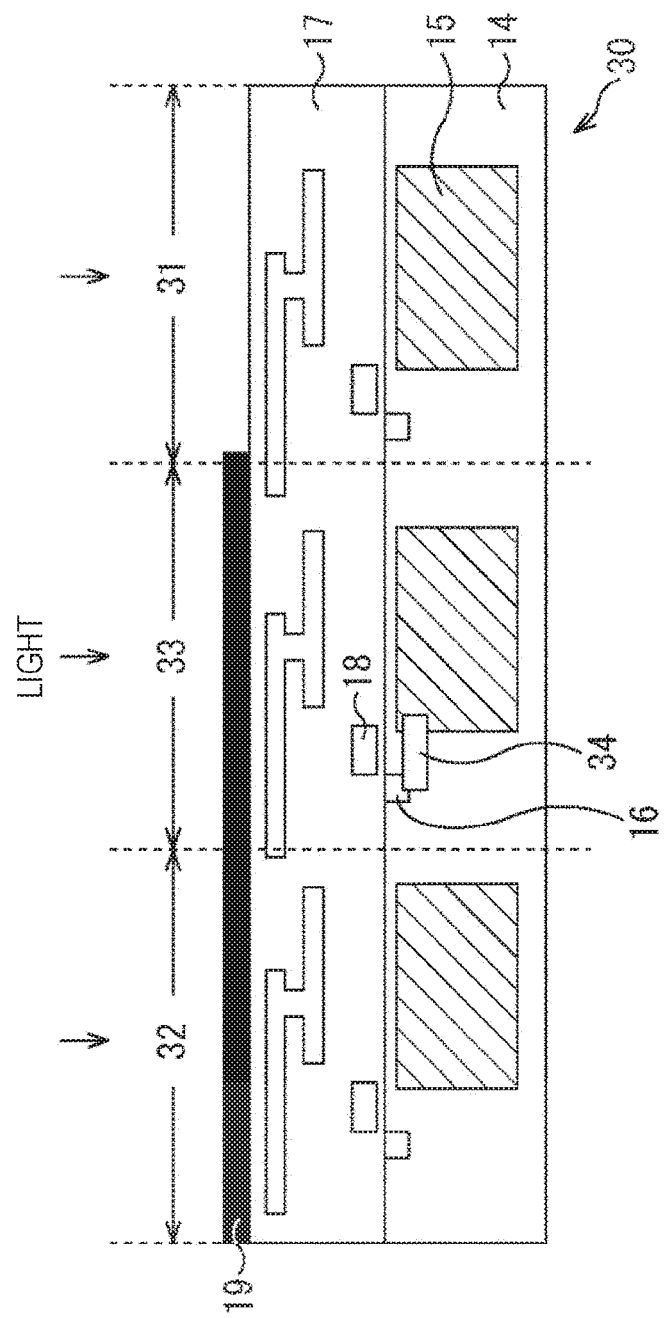

SOLID-STATE IMAGING DEVICE AND ELECTRONIC APPARATUS

CROSS REFERENCE TO RELATED APPLICATIONS

The present application is a continuation application of U.S. patent application Ser. No. 16/086,312, filed Sep. 18, 2018, which is a National Stage Entry of PCT/JP2017/010864, filed Mar. 17, 2017, which claims the benefit of priority from Japanese Patent Application No. JP 2016-070059 filed in the Japan Patent Office on Mar. 31, 2016. Each of the above-referenced applications is hereby incorporated herein by reference in its entirety.

TECHNICAL FIELD

The present disclosure relates to a solid-state imaging device and an electronic apparatus, and more particularly, to a solid-state imaging device that has a dummy pixel disposed between an aperture pixel for generating a normal pixel signal and an optical black (OPB) pixel for generating a pixel signal indicating a dark current component, and an electronic apparatus.

BACKGROUND ART

There is a known conventional configuration in which a large number of pixels arranged in rows and columns in a pixel array are divided into aperture pixels, OPB pixels, and dummy pixels in a solid-state imaging device such as a CMOS image sensor (see Patent Document 1, for example).

In this specification, an aperture pixel, an OPB pixel, and a dummy pixel are defined as follows.

An aperture pixel is a pixel that is open without any light shielding film on the light incident surface side, and generates a pixel signal by performing photoelectric conversion in accordance with incident light. Normally, such an aperture pixel is also called an effective pixel or a normal pixel. An OPB pixel is a pixel that has a light shielding film formed on the light incident surface side so that incident light is blocked, and generates a pixel signal indicating the dark current component in a state where there is no incident light. A dummy pixel is a pixel formed between an aperture pixel and an OPB pixel, to reduce the influence on the OPB pixel in a case where blooming has occurred in the aperture pixel.

FIG. 1 shows a first conventional example indicating the configuration of a solid-state imaging device in which a dummy pixel is formed between an aperture pixel and an OPB pixel.

In this solid-state imaging device 10, an aperture pixel 11 is disposed in the central region of a pixel array, an OPB pixel 12 is disposed in the marginal region, and a dummy pixel 13 is disposed between the aperture pixel 11 and the OPB pixel 12.

In the solid-state imaging device 10, a Si substrate 14 and a wiring layer 17 are stacked as a configuration to be shared by the aperture pixel 11, the OPB pixel 12, and the dummy pixel 13, and photodiodes (PDs) 15 that perform photoelectric conversion and floating diffusions (FDs) 16 that temporarily store electric charges are formed in the Si substrate 14. In the wiring layer 17, transfer gates 18 for transferring electric charges from the PDs 15 to the FDs 16 are formed.

A light shielding film 19 is formed on the light incident surface side of the OPB pixel 12 and the dummy pixel 13. Meanwhile, the light incident surface side of the aperture pixel 11 is not shielded from light, but is open.

The dummy pixel 13 is provided with a connecting portion 20 that connects the PD 15 directly to a Vdd wiring line.

In the dummy pixel 13 of the solid-state imaging device 10, the PD 15 is fixed at a constant voltage (Vdd in this case). Accordingly, in a case where blooming occurs in the aperture pixel 11, the electric charges that have flowed into the PD 15 can be released to the Vdd wiring line.

FIG. 2 shows a second conventional example indicating the configuration of a solid-state imaging device in which a dummy pixel is formed between an aperture pixel and an OPB pixel.

In this solid-state imaging device 30, an aperture pixel 31 is disposed in the central region of a pixel array, an OPB pixel 32 is disposed in the marginal region, and a dummy pixel 33 is disposed between the aperture pixel 31 and the OPB pixel 32.

In the solid-state imaging device 30, a Si substrate 14 and a wiring layer 17 are stacked as a configuration to be shared by the aperture pixel 31, the OPB pixel 32, and the dummy pixel 33. In the Si substrate 14, PDs 15 that perform photoelectric conversion, and FDs 16 that temporarily store electric charges transferred from the PDs 15 are formed. In the wiring layer 17, transfer gates 18 for transferring electric charges from the PDs 15 to the FDs 16 are formed.

A light shielding film 19 is formed on the light incident surface side of the OPB pixel 32 and the dummy pixel 33. Meanwhile, the light incident surface side of the aperture pixel 31 is not shielded from light, but is open.

In the dummy pixel 33, a connecting portion 34 that connects the FD 16 and the PD 15 is provided under the transfer gate 18.

In the dummy pixel 33 of the solid-state imaging device 30, the FD 16 and the PD 15 of a high potential are connected by the connecting portion 34. Accordingly, in a case where blooming occurs in the aperture pixel 31, the electric charges that have flowed into the PD 15 can be released through the FD 16.

CITATION LIST

Patent Document

Patent Document 1: Japanese Patent Application Laid-Open No. 2008-103472

SUMMARY OF THE INVENTION

Problems to be Solved by the Invention

The dummy pixel 13 in the first conventional example and the dummy pixel 33 in the second conventional example described above can be applied in cases where the PD 14 as a photoelectric conversion portion is formed inside the Si substrate 14, but cannot be used in configurations in which an organic photoelectric conversion film or the like serving as a photoelectric conversion portion is formed outside the Si substrate 14.

The present disclosure is made in view of such circumstances, and is to reduce the influence on an OPB pixel in a case where blooming has occurred in an aperture pixel in a configuration having a photoelectric conversion portion formed outside a Si substrate.

Solutions to Problems

A solid-state imaging device that is a first aspect of the present disclosure has a first photoelectric conversion portion, an upper electrode, and a lower electrode formed outside a substrate, the first photoelectric conversion portion performing photoelectric conversion in accordance with incident light, the upper electrode and the lower electrode being formed to sandwich the first photoelectric conversion portion. The solid-state imaging device includes: an aperture pixel that is disposed on a pixel array, and generates a normal pixel signal; an OPB pixel that is disposed at an end portion on the pixel array, and generates a pixel signal indicating a dark current component; and a charge releasing portion that is disposed between the aperture pixel and the OPB pixel, and releases electric charge flowing out from the aperture pixel.

The charge releasing portion may be a dummy pixel disposed between the aperture pixel and the OPB pixel, and the lower electrode corresponding to the dummy pixel may be fixed at a constant voltage.

The lower electrode corresponding to the dummy pixel may be connected to a power supply voltage wiring line.

The lower electrode corresponding to the dummy pixel may be connected to a power supply voltage wiring line via a control transistor that is always on.

At least one of the dummy pixel may be disposed between the aperture pixel and the OPB pixel.

The dummy pixel may be disposed to surround the region where the aperture pixel is disposed.

The charge releasing portion may be formed with the lower electrode fixed at a constant voltage.

The charge releasing portion formed with the lower electrode fixed at a constant voltage may be disposed around each aperture pixel.

The solid-state imaging device that is the first aspect of the present disclosure may further include a second photoelectric conversion portion that is formed in the substrate, and has a different wavelength band for photoelectric conversion from that of the first photoelectric conversion portion.

The second photoelectric conversion portion corresponding to the dummy pixel may be connected to a power supply voltage wiring line.

The second photoelectric conversion portion corresponding to the dummy pixel may be connected to an FD via a control transistor that is always on.

The solid-state imaging device that is the first aspect of the present disclosure may further include a third photoelectric conversion portion that is formed in the substrate, and has a different wavelength band for photoelectric conversion from those of the first and second photoelectric conversion portions.

The third photoelectric conversion portion corresponding to the dummy pixel may be connected to a power supply voltage wiring line.

The third photoelectric conversion portion corresponding to the dummy pixel may be connected to an FD via a control transistor that is always on.

The solid-state imaging device that is the first aspect of the present disclosure may further include a light shielding portion that shields the charge releasing portion and the OPB pixel from light.

The solid-state imaging device may be of a back-illuminated type.

An electronic apparatus that is a second aspect of the present disclosure includes a solid-state imaging device having a first photoelectric conversion portion, an upper electrode, and a lower electrode formed outside a substrate, the first photoelectric conversion portion performing photoelectric conversion in accordance with incident light, the upper electrode and the lower electrode being formed to sandwich the first photoelectric conversion portion. The solid-state imaging device includes: an aperture pixel that is disposed on a pixel array, and generates a normal pixel signal; an OPB pixel that is disposed at an end portion on the pixel array, and generates a pixel signal indicating a dark current component; and a charge releasing portion that is disposed between the aperture pixel and the OPB pixel, and releases electric charge flowing out from the aperture pixel.

In the first and second aspects of present disclosure, electric charges that have flowed out from an aperture pixel are released by a charge releasing portion disposed between the aperture pixel and an OPB pixel.

Effects of the Invention

According to the first and second aspects of the present disclosure, it is possible to reduce the influence on an OPB pixel in a case where blooming has occurred in an aperture pixel.

BRIEF DESCRIPTION OF DRAWINGS

FIG. 1 is a block diagram showing a first conventional example of a solid-state imaging device.

FIG. 2 is a block diagram showing a second conventional example of a solid-state imaging device.

MODE FOR CARRYING OUT THE INVENTION

The following is a detailed description of the best modes for carrying out the present disclosure (these modes will be hereinafter referred to as the embodiments), with reference to the drawings.

First Embodiment

Figures 3A, 3B:
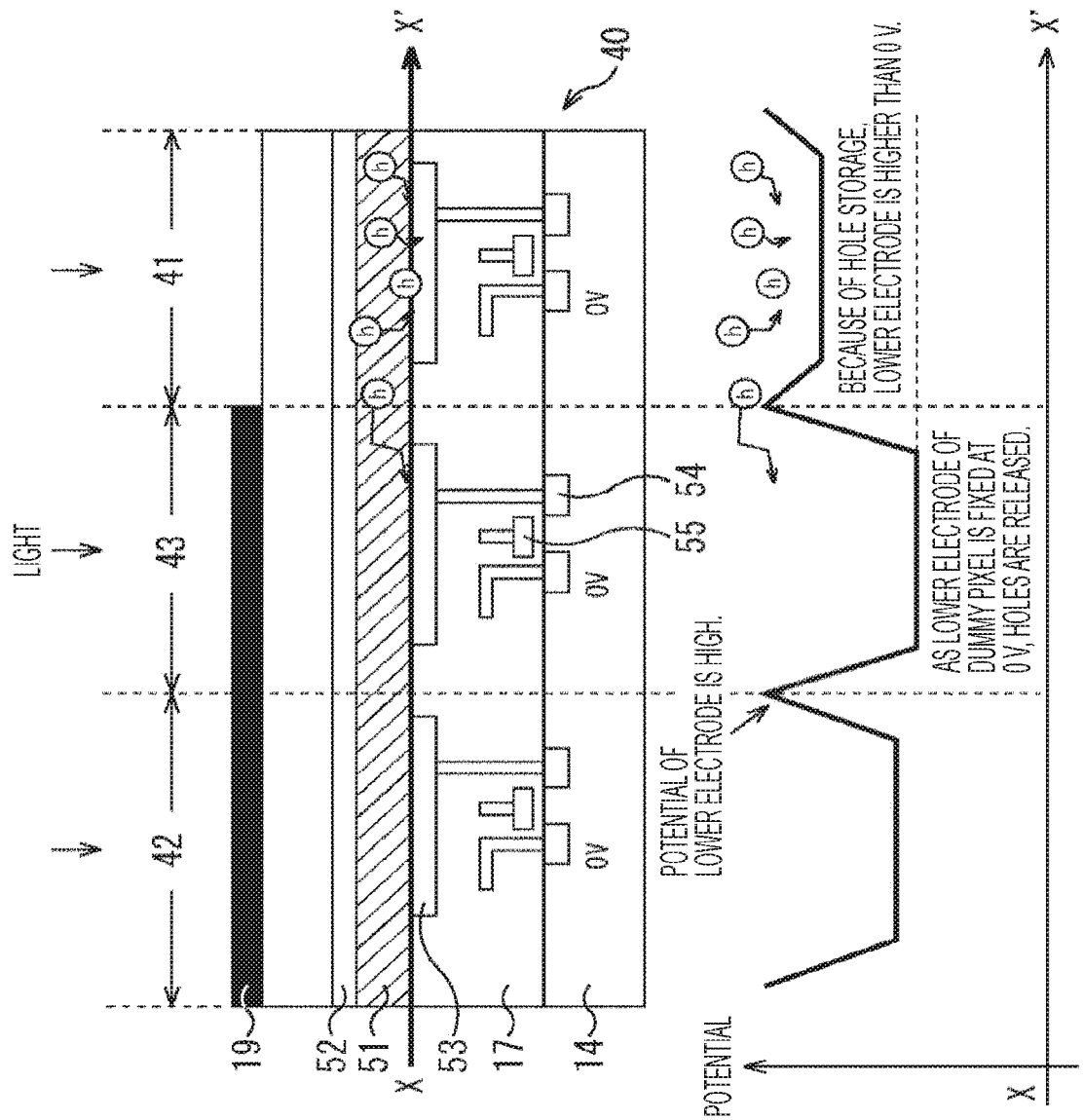
FIGS. 3A and 3B are diagrams showing a first example configuration of a solid-state imaging device to which the present disclosure is applied.

FIGS. 3A and 3B show a first example configuration (a first embodiment) of a solid-state imaging device to which present disclosure is applied. FIG. 3A is a cross-sectional view, and FIG. 3B is a graph of the potential corresponding to the line segment X-X' shown in FIG. 3A.

Note that, in the respective embodiments described below, the same components as those of the first and second conventional examples are denoted by the same reference numerals as those used in the first and second conventional examples, and explanation of them is not unnecessarily repeated herein.

In this solid-state imaging device 40, an aperture pixel 41 is disposed in the central region of a pixel array, an OPB pixel 42 is disposed in the marginal region, and a dummy pixel 43 is disposed between the aperture pixel 41 and the OPB pixel 42. Note that, although only one dummy pixel 43 is formed between the aperture pixel 41 and the OPB pixel 42 in this case illustrated in the drawing, two or more dummy pixels 43 may be formed between the aperture pixel 41 and the OPB pixel 42. The same applies in each of the embodiments described later.

The solid-state imaging device 40 has a structure in which a Si substrate 14, a wiring layer 17, and an organic photoelectric conversion film 51 are stacked in this order from the lower layer side as a configuration to be shared by the aperture pixel 41, the OPB pixel 42, and the dummy pixel 43. Upper electrodes 52 and lower electrodes 53 for applying voltage to the organic photoelectric conversion film 51 are formed on and under the organic photoelectric conversion film 51. In the Si substrate 14, FDs 54 that temporarily store electric charges transferred from the organic photoelectric conversion film 51 via the lower electrodes 53 are formed. The FDs 54 are connected to the lower electrodes 53. In the wiring layer 17, in addition to various wiring lines, reset gates 55 for resetting the voltage of the FDs 54 are formed. A specific voltage supply line for applying a reset voltage or a predetermined discharge voltage is connected to the reset gates 55 connected to the FDs 54. The voltage to be supplied by the specific voltage supply line is 0 V, for example.

In the solid-state imaging device 40, as a result of an exposure operation, holes are read as signal charges, through the lower electrodes 53, out of the electron-hole pairs generated by the organic photoelectric conversion film 51.

A light shielding film 19 is formed on the light incident surface side of the OPB pixel 42 and the dummy pixel 43. Meanwhile, the light incident surface side of the aperture pixel 41 is not shielded from light, but is open.

Prior to the exposure operation, the solid-state imaging device 40 resets the aperture pixel 41 and the OPB pixel 42. At the time of resetting, the resetting is performed so that the potentials of the lower electrodes 53 and the FDs 54 become lower than the potential of the upper electrodes 52. For example, the same positive voltage is applied to the upper electrodes 52 of the aperture pixel 41, the OPB pixel 42, and the dummy pixel 43, and the reset gates 55 of the aperture pixel 41 and the OPB pixel 42 are put into an active state, so that the lower electrodes 53 and the FDs 54 are reset to the reset voltage (0 V). In the dummy pixel 43 of the solid-state imaging device 40, the reset gate 55 corresponding to the organic photoelectric conversion film 51 is always on, and the FD 54 and the lower electrode 53 are fixed at the discharge voltage. The discharge voltage may be the same voltage as the reset voltage (0 V).

After the lower electrodes 53 and the FDs 54 are reset, the reset gates 55 are put into an inactive state (in other words, closed), so that the reset operation is terminated, and an exposure operation (in other words, a charge storage operation) is started. During the exposure operation period, the same positive voltage is applied to the upper electrodes of the aperture pixel 41, the OPB pixel 42, and the dummy pixel 43, as in the reset operation period.

Since the reset gates 55 are closed during the exposure operation period, the holes generated as a result of light incidence are stored in the lower electrode 53 and the FD 54 in the aperture pixel 41. Because of this, the potentials of the lower electrode 53 and the FD 54 become higher than the reset voltage.

Note that, in the OPB pixel 42 shielded from incident light by the light shielding film 19, the potential of the lower electrode 53 is a potential reflecting the magnitude of noise such as dark current generated during the exposure operation period.

In the dummy pixel 43, the reset gate 55 corresponding to the organic photoelectric conversion film 51 is always on, and accordingly, the FD 54 and the lower electrode 53 are also fixed at the discharge voltage (0 V) during the exposure operation period.

In a case where excessive light enters the aperture pixel 41 during the exposure period, on the other hand, the holes generated in the aperture pixel 41 are stored in the lower electrode 53 and the FD 54 of the pixel, and further, a phenomenon that the holes flow into the lower electrode of an adjacent pixel, or blooming, might occur.

In the solid-state imaging device 40, however, even if excessive light enters the outermost aperture pixel 41 among aperture pixels 41 arranged in an array, and blooming occurs, the extra generated holes flow into the lower electrode 53 of the dummy pixel 43, and are released to the specific voltage supply line via the FD 54 and the reset gate 55. Thus, the electric charges that have flowed out from the aperture pixel 41 can be prevented from flowing into the OPB pixel 42.

Furthermore, the potential is high between the lower electrode 53 of the dummy pixel 43 and the lower electrode 53 of the OPB pixel 42. Thus, holes can be prevented from flowing out from the lower electrode 53 of the dummy pixel 43 and flowing into the lower electrode 53 of the OPB pixel 42.

Figure 4:
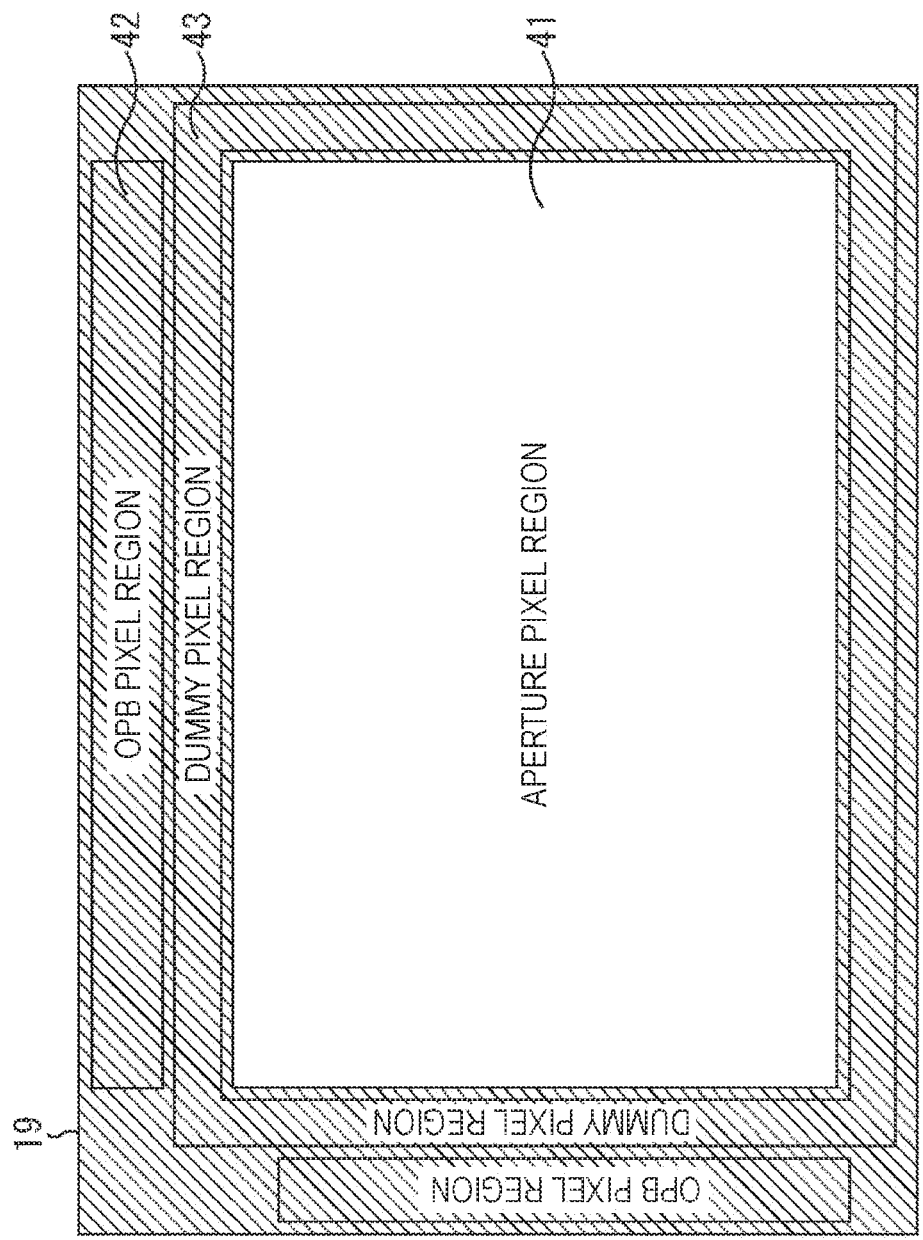
FIG. 4 is a diagram showing a modification of the first example configuration of a solid-state imaging device.

FIG. 4 shows a modification of the solid-state imaging device 40. In this modification, a dummy pixel 43 is disposed between an aperture pixel 41 and an OPB pixel 42, and dummy pixels 43 are further disposed on the right side and the lower side on which any OPB pixel 42 is not disposed in the drawing. In this arrangement, the dummy pixels 43 surround the region of the aperture pixels 41. Thus, the electric charges from the aperture pixels 41 can be prevented from flowing to the outside of the dummy pixels 43.

Note that the modification shown in FIG. 4 can also be applied to each of the embodiments described later.

Second Embodiment

Figure 5:
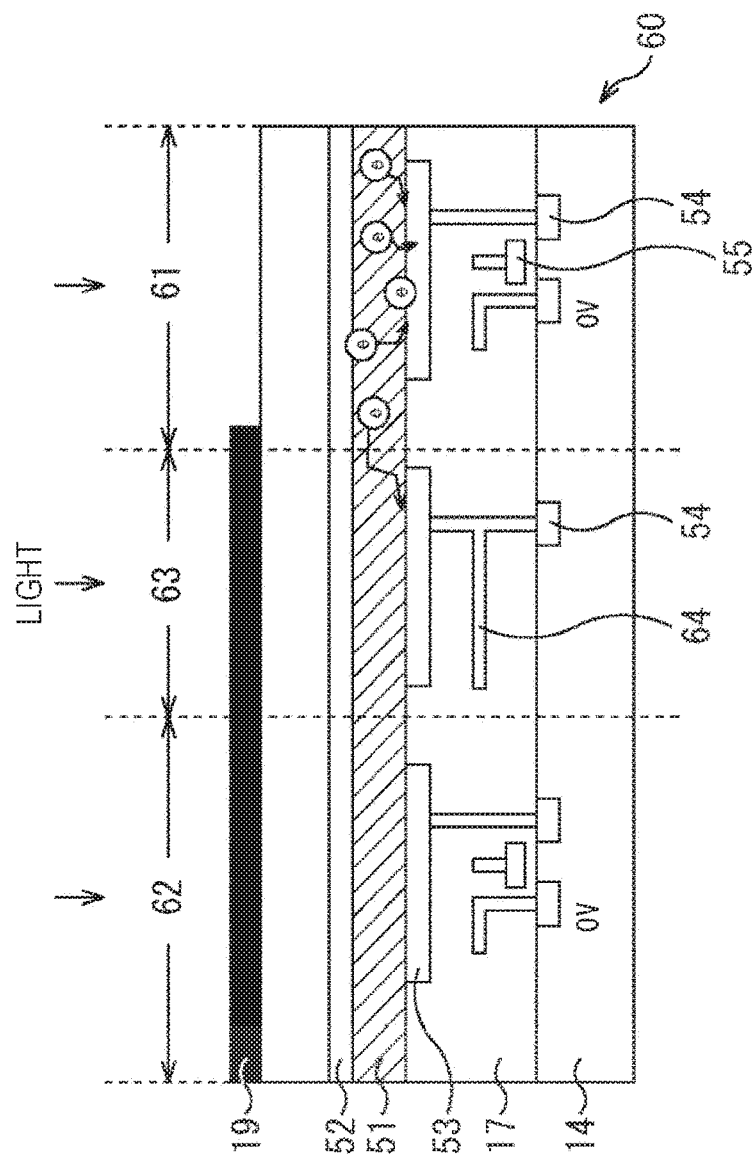
FIG. 5 is a diagram showing a second example configuration of a solid-state imaging device to which the present disclosure is applied.

In addition, FIG. 5 shows a cross-sectional view of a second example configuration (a second embodiment) of a solid-state imaging device to which present disclosure is applied.

In this solid-state imaging device 60, an aperture pixel 61 is disposed in the central region of a pixel array, an OPB pixel 62 is disposed in the marginal region, and a dummy pixel 63 is disposed between the aperture pixel 61 and the OPB pixel 62.

The solid-state imaging device 60 has a structure in which a Si substrate 14, a wiring layer 17, and an organic photoelectric conversion film 51 are stacked in this order from the lower layer side as a configuration to be shared by the aperture pixel 61, the OPB pixel 62, and the dummy pixel 63. Upper electrodes 52 and lower electrodes 53 for applying voltage to the organic photoelectric conversion film 51 are formed on and under the organic photoelectric conversion film 51. In the Si substrate 14, FDs 54 connected to the lower electrodes 53 are formed.

Reset gates 55 for resetting the voltage of the FDs 54 to the reset voltage (0 V) are formed in the wiring layer 17 of the aperture pixel 61 and the OPB pixel 62.

On the other hand, a connecting portion 64 for connecting the lower electrode 53 and the FD 54 to a Vss wiring line is formed in the wiring layer 17 of the dummy pixel 63.

A light shielding film 19 is formed on the light incident surface side of the OPB pixel 62 and the dummy pixel 63. Meanwhile, the light incident surface side of the aperture pixel 61 is not shielded from light, but is open.

In the dummy pixel 63 of the solid-state imaging device 60, the FD 54 and the lower electrode 53 are fixed at a constant voltage (Vss). On the other hand, in a case where blooming occurs, holes are stored in the lower electrode 53 of the aperture pixel 61, and therefore, the potential becomes higher than Vss. As a result, the holes stored in the lower electrode 53 of the aperture pixel 61 flow into the lower electrode 53 of the dummy pixel 63, and are released to the Vss wiring line via the FD 54 and the connecting portion 64. Thus, the electric charges that have flowed out from the aperture pixel 61 can be prevented from flowing into the OPB pixel 62.

Furthermore, the potential is high between the lower electrode 53 of the dummy pixel 63 and the lower electrode 53 of the OPB pixel 62. Thus, holes can be prevented from flowing out from the lower electrode 53 of the dummy pixel 63 and flowing into the lower electrode 53 of the OPB pixel 62.

Third Embodiment

Figure 6:
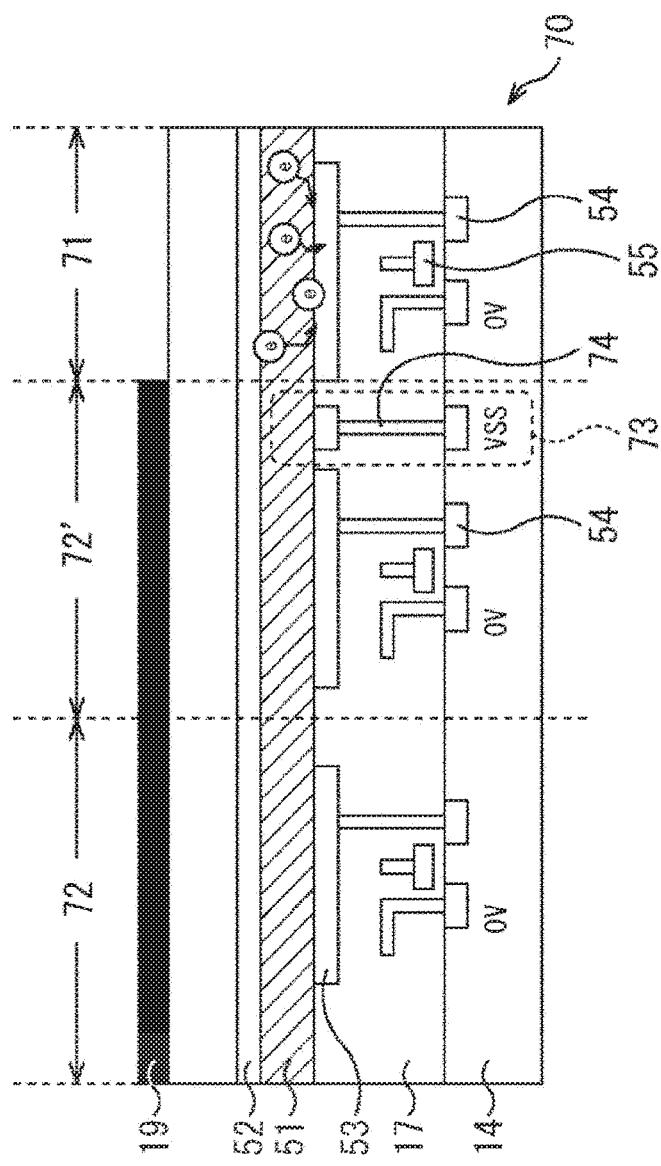
FIG. 6 is a diagram showing a third example configuration of a solid-state imaging device to which the present disclosure is applied.

In addition, FIG. 6 shows a cross-sectional view of a third example configuration (a third embodiment) of a solid-state imaging device to which present disclosure is applied.

In this solid-state imaging device 70, an aperture pixel 71 is disposed in the central region of a pixel array, and OPB pixels 72 are disposed in the marginal region. Note that the OPB pixel 72 adjacent to the aperture pixel 71 is specifically referred to as the OPB pixel 72'.

The solid-state imaging device 70 has a structure in which a Si substrate 14, a wiring layer 17, and an organic photoelectric conversion film 51 are stacked in this order from the lower layer side as a configuration to be shared by the aperture pixel 71 and the OPB pixels 72. Upper electrodes 52 and lower electrodes 53 for applying voltage to the organic photoelectric conversion film 51 are formed on and under the organic photoelectric conversion film 51. FDs 54 are formed in the Si substrate 14. Reset gates 55 for resetting the voltage of the FDs 54 to the reset voltage (0 V) are formed in the wiring layer 17.

A drain portion 73 is added to the wiring layer 17 of the OPB pixel 72' adjacent to the aperture pixel 71, and a lower electrode 74 connected to the Vss wiring line is formed in the drain portion 73.

A light shielding film 19 is formed on the light incident surface side of the OPB pixels 72. Meanwhile, the light incident surface side of the aperture pixel 71 is not shielded from light, but is open.

In the OPB pixel 72' adjacent to the aperture pixel 71 of the solid-state imaging device 70, the lower electrode 74 is fixed at a constant voltage (Vss). On the other hand, in a case where blooming occurs, holes are stored in the lower electrode 53 of the aperture pixel 71, and therefore, the potential becomes higher than Vss. As a result, the holes stored in the lower electrode 53 of the aperture pixel 71 are released to the Vss wiring line via (the lower electrode 74 of) the drain portion 73 of the OPB pixel 72'. Thus, the electric charges that have flowed out from the aperture pixel 41 can be prevented from flowing into the OPB pixel 72.

Furthermore, the potential is high between the lower electrode 74 and the lower electrode 53 of the OPB pixel 72'. Thus, holes can be prevented from flowing out from the lower electrode 74 and flowing into the lower electrode 53 of the OPB pixel 72'.

Note that, although only one OPB pixel 72' is formed between the aperture pixel 71 and the OPB pixel 72 in this case illustrated in the drawing, two or more OPB pixels 72' may be formed between the aperture pixel 71 and the OPB pixel 72.

Figure 7:
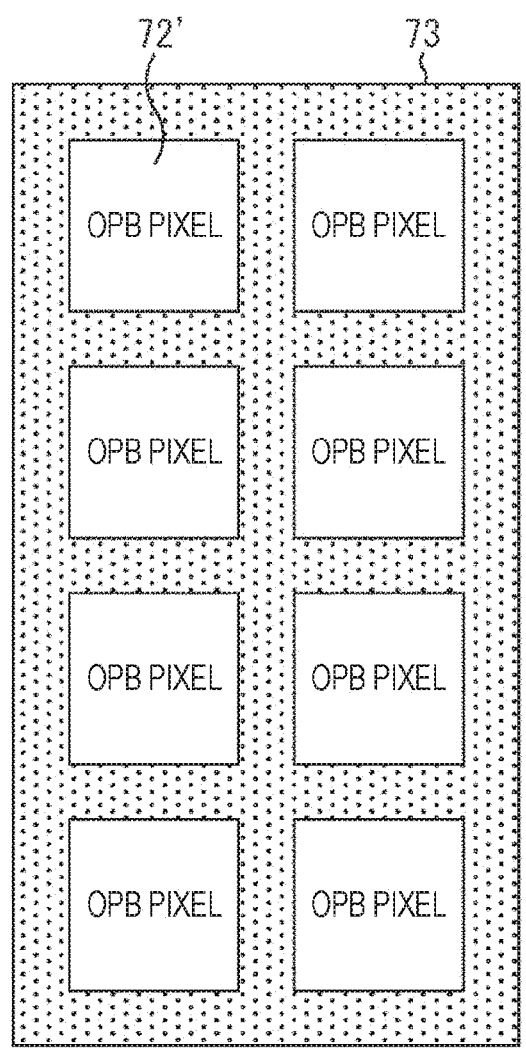
FIG. 7 is a diagram showing a first modification of the third example configuration of a solid-state imaging device.

FIG. 7 shows a first modification of the solid-state imaging device 70. In the first modification, all the pixels in the entire OPB pixel region are OPB pixels 72', and a drain portion 73 (in other words, a lower electrode 74 connected to a Vss wiring line) is formed between each two pixels. Thus, inflow of electric charges into each OPB pixel 72' can be prevented.

Figure 8:
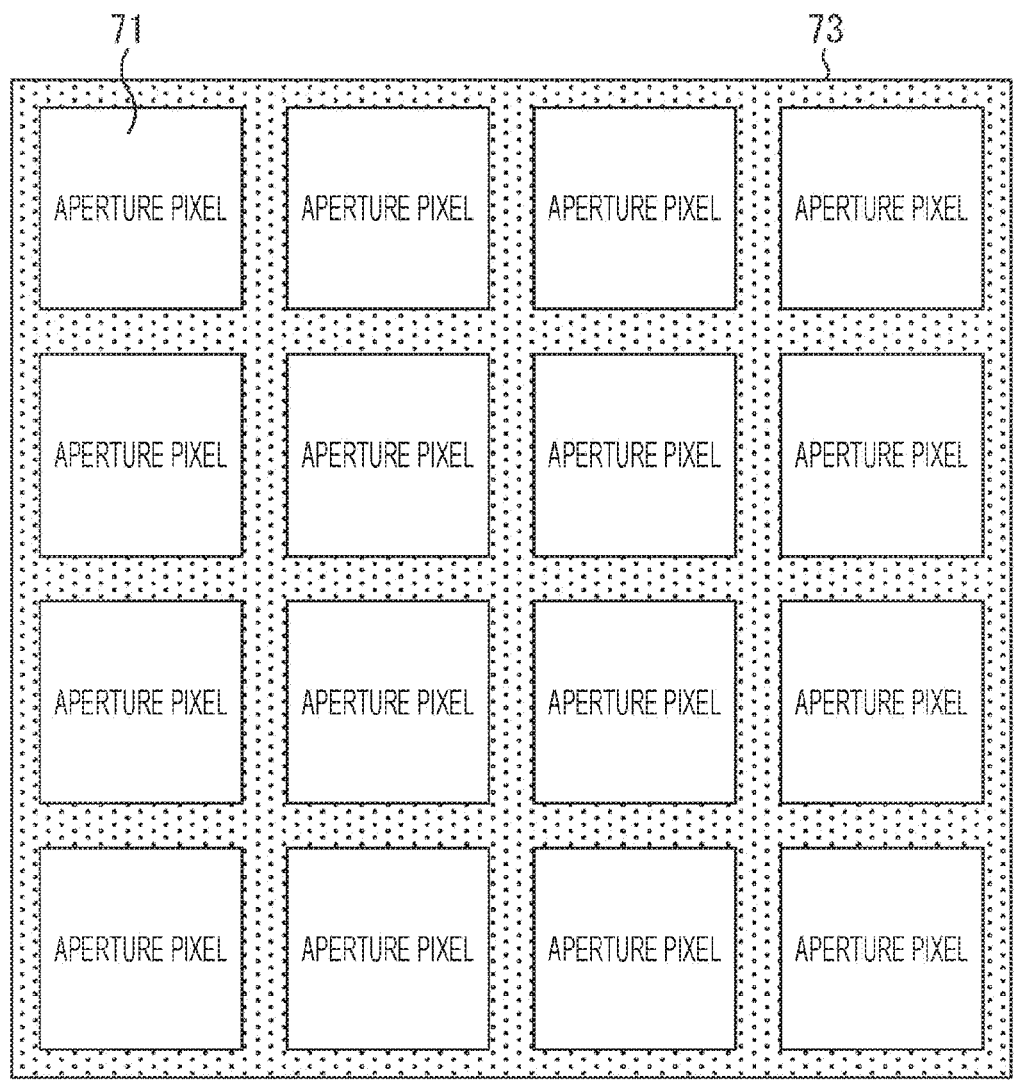
FIG. 8 is a diagram showing a second modification of the third example configuration of a solid-state imaging device.

FIG. 8 shows a second modification of the solid-state imaging device 70. In the second modification, a drain portion 73 (in other words, a lower electrode 74 connected to a Vss wiring line) is formed between each two pixels of all the aperture pixels 71. Thus, outflow of electric charges from the respective aperture pixels 71 can be prevented.

Fourth Embodiment

Figure 9:
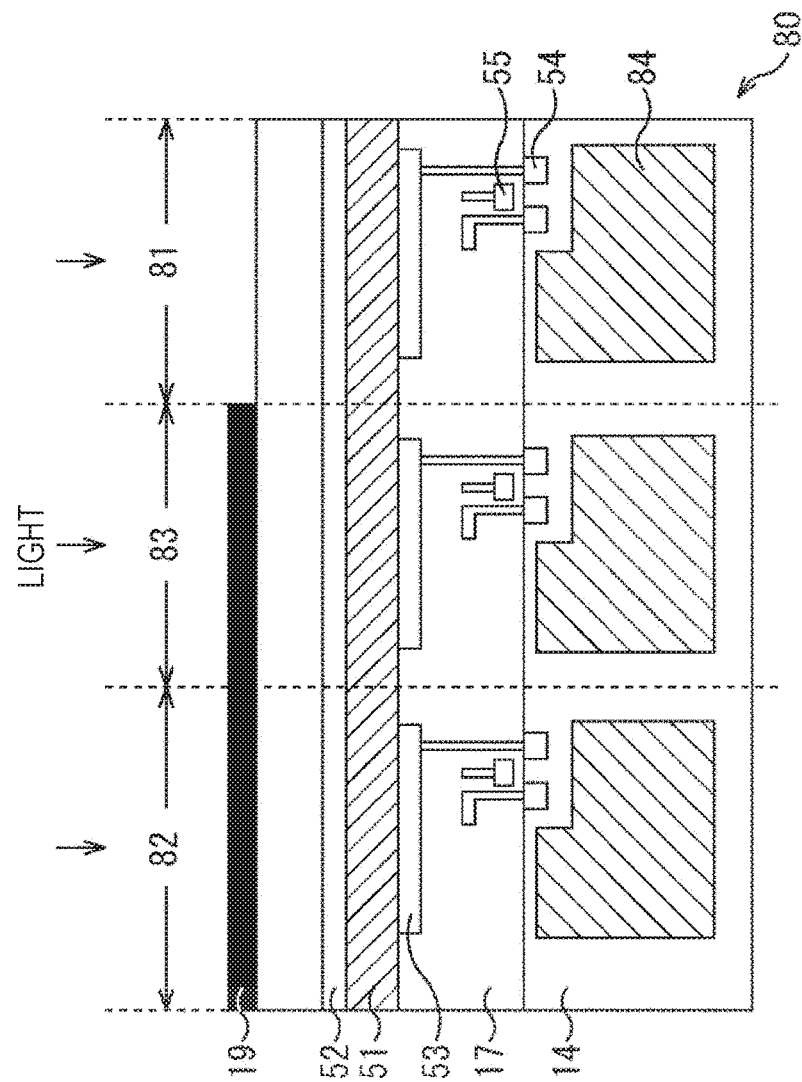
FIG. 9 is a diagram showing a fourth example configuration of a solid-state imaging device to which the present disclosure is applied.

In addition, FIG. 9 shows a cross-sectional view of a fourth example configuration (a fourth embodiment) of a solid-state imaging device to which present disclosure is applied.

In this solid-state imaging device 80, an aperture pixel 81 is disposed in the central region of a pixel array, an OPB pixel 82 is disposed in the marginal region, and a dummy pixel 83 is disposed between the aperture pixel 81 and the OPB pixel 82.

The solid-state imaging device 80 differs from the solid-state imaging device 50 shown in FIGS. 3A and 3B in that PDs 84 that perform photoelectric conversion in accordance with light of a different wavelength from that of the organic photoelectric conversion film 51 are added in the Si substrate 14. However, the FDs, the transfer gates, and the like corresponding to the PDs 84 are not shown in the drawing. The other aspects of the configuration are the same as those of the solid-state imaging device 50.

As for the organic photoelectric conversion film 51 of the dummy pixel 83 in the solid-state imaging device 80, the reset gate 55 is always on, and the FD 54 and the lower electrode 53 corresponding to the organic photoelectric conversion film 51 are fixed at 0 V. Further, as for the PD 84 of the dummy pixel 83, the potential of the PD 84 is fixed at Vdd, the PD 84 is connected to the corresponding FD, or the transfer gate corresponding to the PD 84 is always on, as shown in FIG. 1 or 2.

Accordingly, in a case where blooming occurs in the aperture pixel 81, the electric charges that have flowed out from the organic photoelectric conversion film 51 of the aperture pixel 81 can be released to a specific voltage supply line via the lower electrode 53, the FD 54, and the reset gate 55 of the dummy pixel 83. At this stage, the potential is high between the lower electrode 53 of the dummy pixel 83 and the lower electrode 53 of the OPB pixel 82. Thus, holes can be prevented from flowing out from the lower electrode 53 of the dummy pixel 83 and flowing into the lower electrode 53 of the OPB pixel 82.

Furthermore, the electric charges that have flowed out from the PD 84 of the aperture pixel 81 can be released to a Vdd wiring line or the corresponding FD via the PD 84 of the dummy pixel 83.

Thus, the electric charges that have flowed out from the aperture pixel 81 can be prevented from flowing into the OPB pixel 82.

Fifth Embodiment

Figure 10:
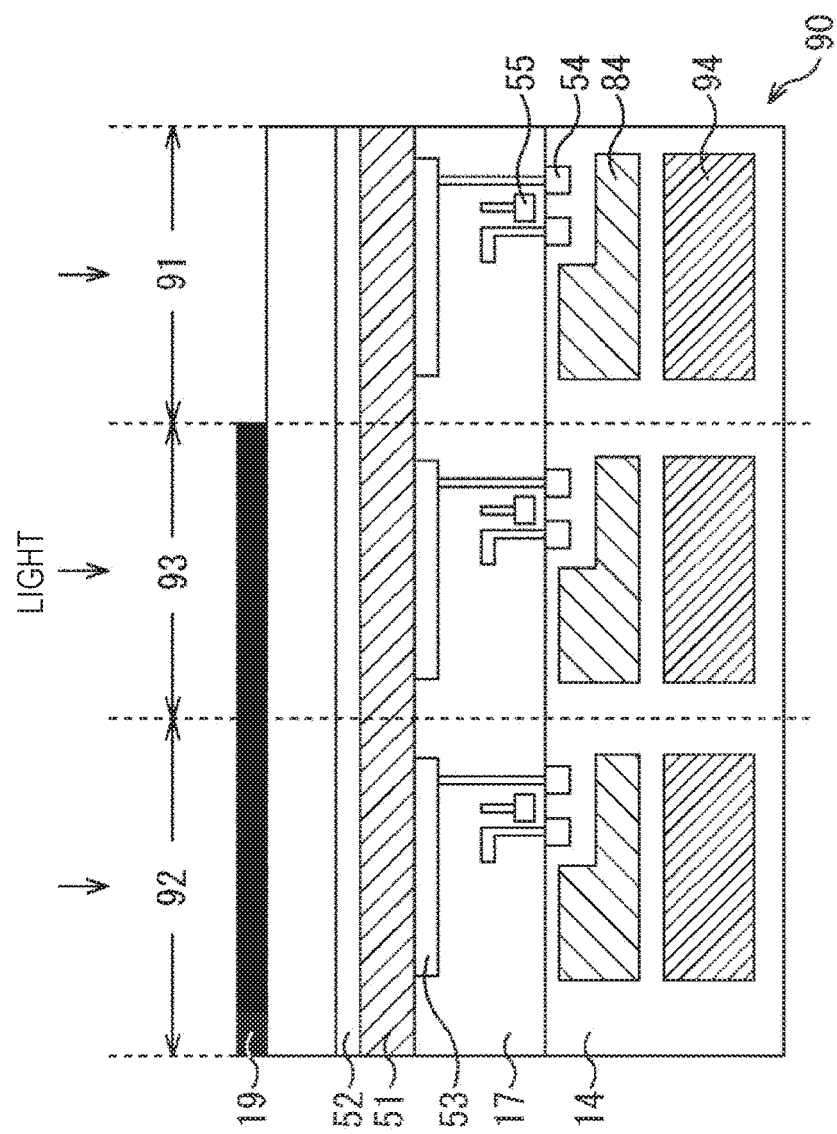
FIG. 10 is a diagram showing a fifth example configuration of a solid-state imaging device to which the present disclosure is applied.

In addition, FIG. 10 shows a cross-sectional view of a fifth example configuration (a fifth embodiment) of a solid-state imaging device to which present disclosure is applied.

In this solid-state imaging device 90, an aperture pixel 91 is disposed in the central region of a pixel array, an OPB pixel 92 is disposed in the marginal region, and a dummy pixel 93 is disposed between the aperture pixel 91 and the OPB pixel 92.

The solid-state imaging device 90 differs from the solid-state imaging device 80 shown in FIG. 9 in that PDs 94 that perform photoelectric conversion in accordance with light of a different wavelength from those of the organic photoelectric conversion film 51 and the PDs 84 are added in the Si substrate 14. However, the FDs, the transfer gates, and the like corresponding to the PDs 94 are not shown in the drawing. The other aspects of the configuration are the same as those of the solid-state imaging device 80.

As for the organic photoelectric conversion film 51 of the dummy pixel 93 in the solid-state imaging device 90, the reset gate 55 is always on, and the FD 54 and the lower electrode 53 corresponding to the organic photoelectric conversion film 51 are fixed at 0 V. Further, as for the PDs 84 and 94 of the dummy pixel 93, the potential of the PDs 84 and 94 is fixed at Vdd, the PDs 84 and 94 are connected to the corresponding FD, or the transfer gate corresponding to the PDs 84 and 94 is always on, as shown in FIG. 1 or 2.

Accordingly, in a case where blooming occurs in the aperture pixel 91, the electric charges that have flowed out from the organic photoelectric conversion film 51 of the aperture pixel 91 can be released to a specific voltage supply line via the lower electrode 53, the FD 54, and the reset gate 55 of the dummy pixel 93. At this stage, the potential is high between the lower electrode 53 of the dummy pixel 93 and the lower electrode 53 of the OPB pixel 92. Thus, holes can be prevented from flowing out from the lower electrode 53 of the dummy pixel 93 and flowing into the lower electrode 53 of the OPB pixel 92.

Furthermore, the electric charges that have flowed out from the PDs 84 and 94 of the aperture pixel 91 can be released to a Vdd wiring line or the corresponding FD via the PDs 84 and 94 of the dummy pixel 93.

Thus, the electric charges that have flowed out from the aperture pixel 91 can be prevented from flowing into the OPB pixel 92.

Sixth Embodiment

Figure 11:
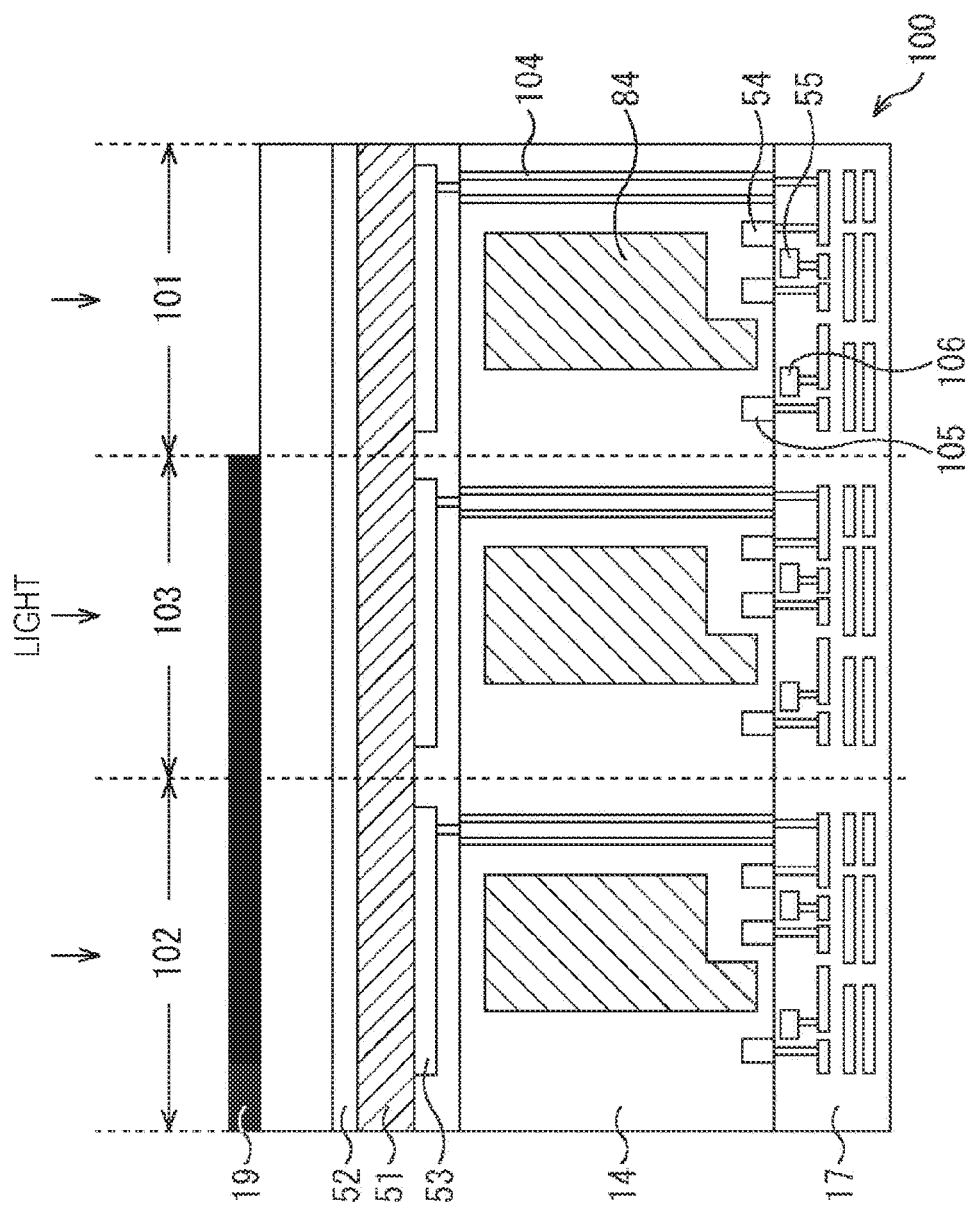
FIG. 11 is a diagram showing a sixth example configuration of a solid-state imaging device to which the present disclosure is applied.

In addition, FIG. 11 shows a cross-sectional view of a sixth example configuration (a sixth embodiment) of a solid-state imaging device to which present disclosure is applied. The first through fifth embodiments described above are of a surface-illuminated type. A solid-state imaging device 100 according to the sixth embodiment is obtained by converting the solid-state imaging device 80 of the fourth embodiment shown in FIG. 9 into a solid-state imaging device of a back-illuminated type. As a back-illuminated type is adopted, it becomes possible to secure a high degree of freedom in wiring and a sufficient quantity of incident light.

In this solid-state imaging device 100, an aperture pixel 101 is disposed in the central region of a pixel array, an OPB pixel 102 is disposed in the marginal region, and a dummy pixel 103 is disposed between the aperture pixel 101 and the OPB pixel 102.

The solid-state imaging device 100 has a structure in which a wiring layer 17, a Si substrate 14, and an organic photoelectric conversion film 51 are stacked in this order from the lower layer side as a configuration to be shared by the aperture pixel 101, the OPB pixel 102, and the dummy pixel 103. Upper electrodes 52 and lower electrodes 53 for applying voltage to the organic photoelectric conversion film 51 are formed on and under the organic photoelectric conversion film 51.

PDs 84 that perform photoelectric conversion in accordance with light of a different wavelength from that of the organic photoelectric conversion film 51 is formed in the Si substrate 14. FDs 54 corresponding to the organic photoelectric conversion film 51 and FDs 105 corresponding to the PDs 84 are further formed in the Si substrate 14. Penetrating electrodes 104 connected to the lower electrodes 53 are further formed in the Si substrate 14.

Reset gates 55 for resetting the FDs 54 and transfer gates 106 for transferring electric charges converted by the PDs 84 to the FDs 105 are formed in the wiring layer 17.

A light shielding film 19 is formed on the light incident surface side of the OPB pixel 102 and the dummy pixel 103. Meanwhile, the light incident surface side of the aperture pixel 101 is not shielded from light, but is open.

In the dummy pixel 103 of the solid-state imaging device 100, the reset gate 55 is always on, and the FD 54 is fixed at 0 V. Accordingly, the lower electrode 53 connected to the FD 54 via the penetrating electrode 104 is also fixed at 0 V. Further, the transfer gate 106 is also always on.

Accordingly, in a case where blooming occurs in the aperture pixel 101, the electric charges that have flowed out from the organic photoelectric conversion film 51 of the aperture pixel 101 flow into the lower electrode 53 of the dummy pixel 103, and are released to a specific voltage supply line via the penetrating electrode 104, the FD 54, and the reset gate 55. At this stage, the potential is high between the lower electrode 53 of the dummy pixel 103 and the lower electrode 53 of the OPB pixel 102. Thus, holes can be prevented from flowing out from the lower electrode 53 of the dummy pixel 103 and flowing into the lower electrode 53 of the OPB pixel 102.

Furthermore, the electric charges that have flowed out from the PD 84 of the aperture pixel 101 can be released to the FD 105 via the PD 84 of the dummy pixel 103.

Thus, the electric charges that have flowed out from the aperture pixel 101 can be prevented from flowing into the OPB pixel 102.

Note that PDs that perform photoelectric conversion in accordance with light of a different wavelength from those of the organic photoelectric conversion film 51 and the PDs 84 may be added in the Si substrate 14. In that case, with these PDs, the electric charges that have flowed out from the aperture pixel 101 should be released to the corresponding FDs, as with the PDs 84.

Seventh Embodiment

Figure 12:
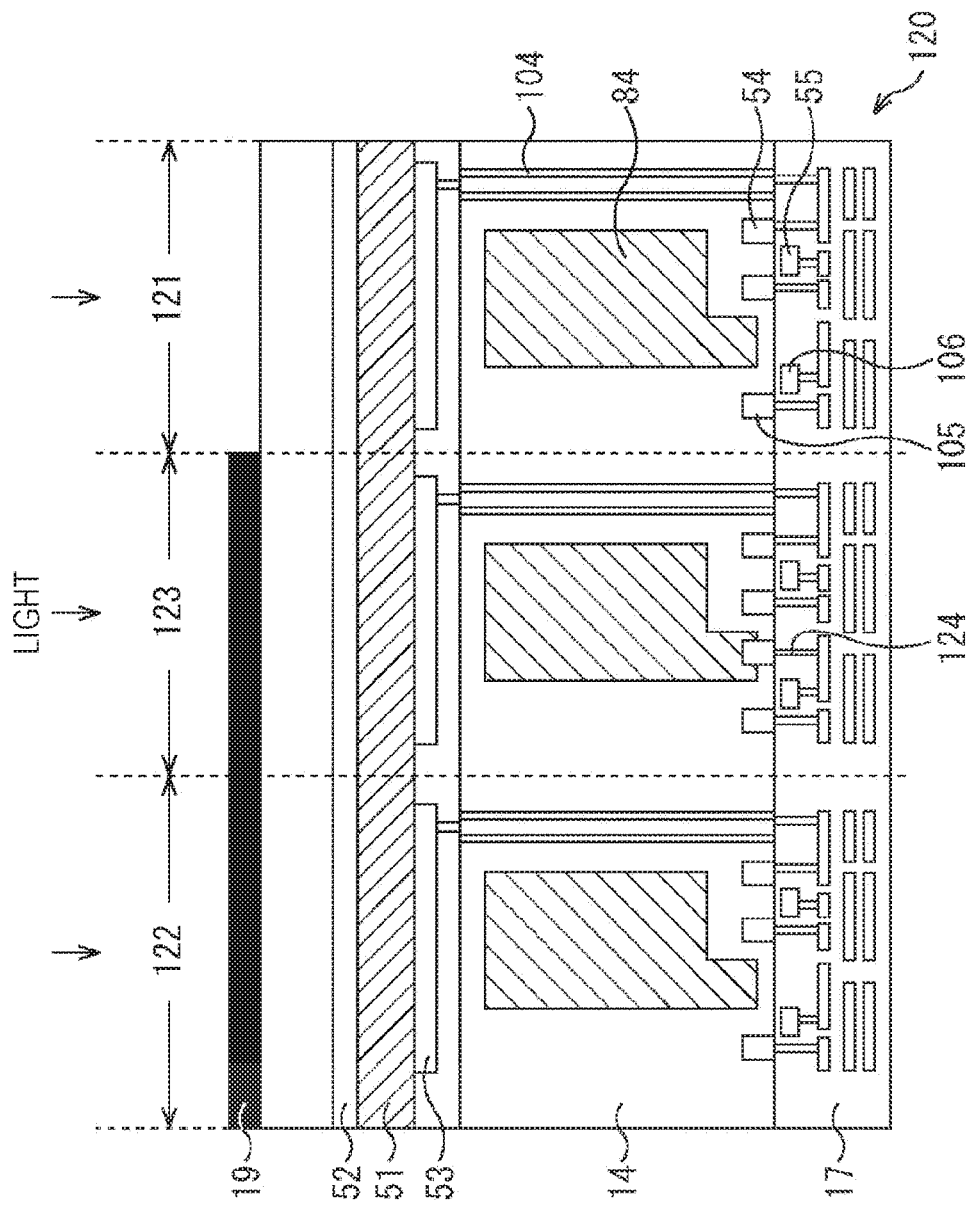
FIG. 12 is a diagram showing a seventh example configuration of a solid-state imaging device to which the present disclosure is applied.

In addition, FIG. 12 shows a cross-sectional view of a seventh example configuration (a seventh embodiment) of a solid-state imaging device to which present disclosure is applied.

A solid-state imaging device 120 according to the seventh embodiment is of a back-illuminated type. An aperture pixel 121 is disposed in the central region of a pixel array, an OPB pixel 122 is disposed in the marginal region, and a dummy pixel 123 is disposed between the aperture pixel 121 and the OPB pixel 122.

The solid-state imaging device 120 differs from the solid-state imaging device 100 shown in FIG. 11 in that a connecting portion 124 that connects the PD 84 directly to the Vdd wiring line is added to the dummy pixel 123.

In the dummy pixel 123 of the solid-state imaging device 120, the reset gate 55 is always on, and the FD 54 is fixed at 0 V. Accordingly, the lower electrode 53 connected to the FD 54 via the penetrating electrode 104 is also fixed at 0 V. Further, the potential of the PD 84 is fixed at Vdd.

Accordingly, in a case where blooming occurs in the aperture pixel 121, the electric charges that have flowed out from the organic photoelectric conversion film 51 of the aperture pixel 121 flow into the lower electrode 53 of the dummy pixel 123, and are released to a specific voltage supply line via the penetrating electrode 104, the FD 54, and the reset gate 55. At this stage, the potential is high between the lower electrode 53 of the dummy pixel 123 and the lower electrode 53 of the OPB pixel 122. Thus, holes can be prevented from flowing out from the lower electrode 53 of the dummy pixel 123 and flowing into the lower electrode 53 of the OPB pixel 122.

Furthermore, the electric charges that have flowed out from the PD 84 of the aperture pixel 121 can be released to the Vdd wiring line via the PD 84 of the dummy pixel 123.

Thus, the electric charges that have flowed out from the aperture pixel 121 can be prevented from flowing into the OPB pixel 42.

Note that PDs that perform photoelectric conversion in accordance with light of a different wavelength from those of the organic photoelectric conversion film 51 and the PDs 84 may be added in the Si substrate 14. In that case, with these PDs, the electric charges that have flowed out from the aperture pixel 121 should be released to the corresponding FDs, as with the PDs 84.

The above described first through seventh embodiments of the present disclosure can be combined as appropriate.

<Examples of Use of a Solid-State Imaging Device>

Figure 13:
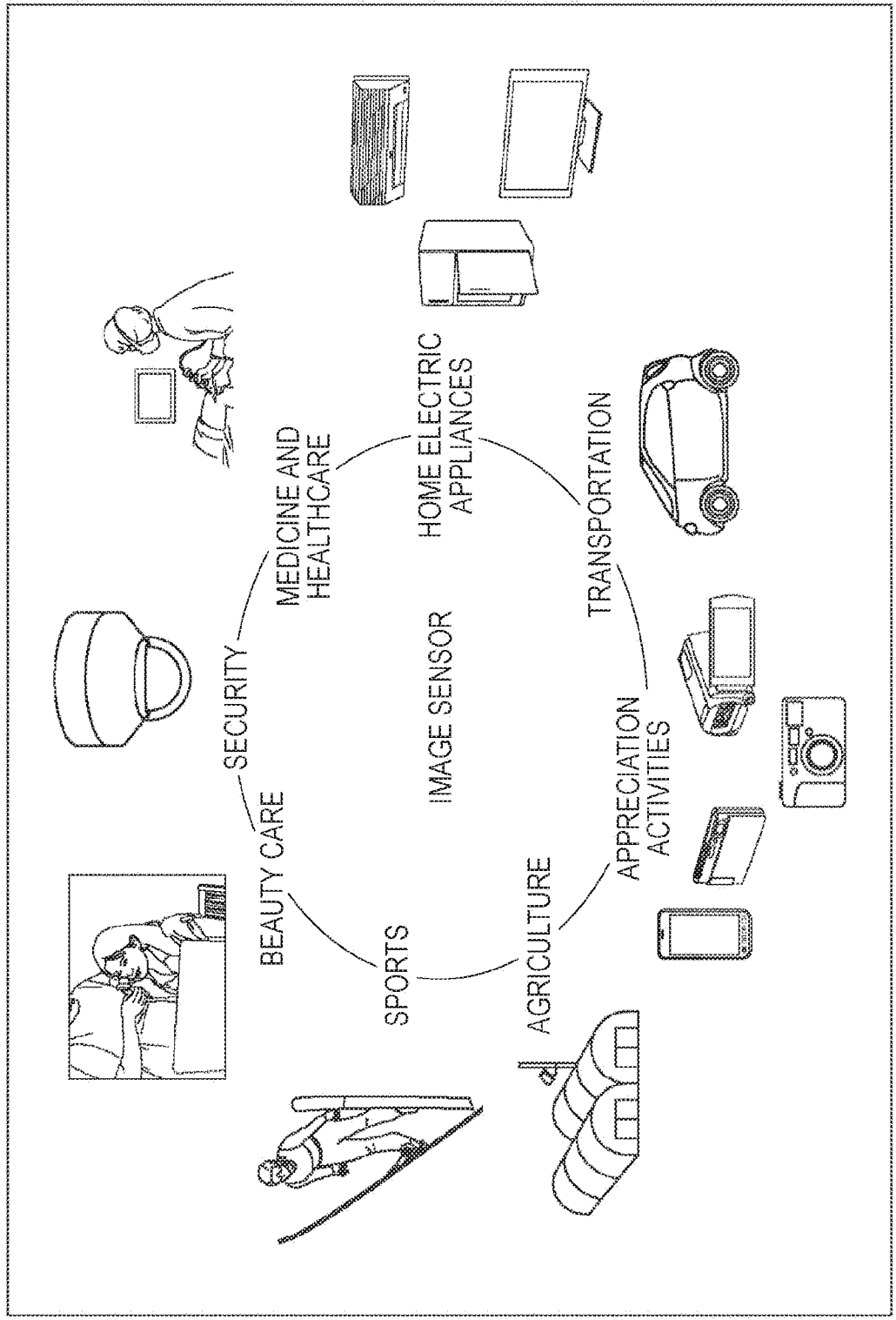
FIG. 13 is a diagram showing examples of use of solid-state imaging devices to which the present disclosure is applied.

FIG. 13 is a diagram showing examples of use of a solid-state imaging device according to any of the first through seventh embodiments of the present disclosure.

The above described solid-state imaging devices can be used in various cases where light, such as visible light, infrared light, ultraviolet light, or X-rays, is to be sensed, as listed below, for example.

Devices configured to take images for appreciation activities, such as digital cameras and portable devices with camera functions.

Devices for transportation use, such as vehicle-mounted sensors configured to take images of the front, the back, the surroundings, the inside, and the like of an automobile to perform safe driving like an automatic stop or recognize a driver's condition and the like, surveillance cameras for monitoring running vehicles and roads, and ranging sensors for measuring distances between vehicles or the like.

Devices to be used in conjunction with home electric appliances, such as television sets, refrigerators, and air conditioners, to take images of gestures of users and operate the appliances in accordance with the gestures.

Devices for medical care use and health care use, such as endoscopes and devices for receiving infrared light for angiography.

Devices for security use, such as surveillance cameras for crime prevention and cameras for personal authentication.

Devices for beauty care use, such as skin measurement devices configured to image the skin and microscopes for imaging the scalp.

Devices for sporting use, such as action cameras and wearable cameras for sports and the like.

Devices for agricultural use such as cameras for monitoring conditions of fields and crops.

Note that embodiments of the present disclosure are not limited to the above described embodiments, and various modifications may be made to them without departing from the scope of the present disclosure.

The present disclosure can also be embodied in the configurations described below.

(1)

A solid-state imaging device that has a first photoelectric conversion portion, an upper electrode, and a lower electrode formed outside a substrate, the first photoelectric conversion portion performing photoelectric conversion in accordance with incident light, the upper electrode and the lower electrode being formed to sandwich the first photoelectric conversion portion, the solid-state imaging device including:

an aperture pixel that is disposed on a pixel array, and generates a normal pixel signal;

an OPB pixel that is disposed at an end portion on the pixel array, and generates a pixel signal indicating a dark current component; and a charge releasing portion that is disposed between the aperture pixel and the OPB pixel, and releases electric charge flowing out from the aperture pixel.

(2)

The solid-state imaging device according to (1), in which the charge releasing portion is a dummy pixel disposed between the aperture pixel and the OPB pixel, and the lower electrode corresponding to the dummy pixel is fixed at a constant voltage.

(3)

The solid-state imaging device according to (1) or (2), in which the lower electrode corresponding to the dummy pixel is connected to a power supply voltage wiring line.

(4)

The solid-state imaging device according to any of (1) to (3), in which the lower electrode corresponding to the dummy pixel is connected to a power supply voltage wiring line via a control transistor that is always on.

(5)

The solid-state imaging device according to any of (2) to (4), in which at least one pixel of the dummy pixel is disposed between the aperture pixel and the OPB pixel.

(6)

The solid-state imaging device according to any of (2) to (5), in which the dummy pixel is disposed to surround a region where the aperture pixel is disposed.

(7)

The solid-state imaging device according to (1), in which the charge releasing portion is formed with the lower electrode fixed at a constant voltage.

(8)

The solid-state imaging device according to (7), in which the charge releasing portion formed with the lower electrode fixed at a constant voltage is disposed around each aperture pixel.

(9)

The solid-state imaging device according to any of (1) to (8), further including a second photoelectric conversion portion that is formed in the substrate, and has a different wavelength band for photoelectric conversion from a wavelength band of the first photoelectric conversion portion.

(10)

The solid-state imaging device according to (9), in which the second photoelectric conversion portion corresponding to the dummy pixel is connected to a power supply voltage wiring line.

(11)

The solid-state imaging device according to (9) or (10), in which the second photoelectric conversion portion corresponding to the dummy pixel is connected to an FD via a control transistor that is always on.

(12)

The solid-state imaging device according to any of (1) to (11), further including a third photoelectric conversion portion that is formed in the substrate, and has a different wavelength band for photoelectric conversion from the wavelength bands of the first and second photoelectric conversion portions.

(13)

The solid-state imaging device according to (12), in which the third photoelectric conversion portion corresponding to the dummy pixel is connected to a power supply voltage wiring line.

(14)

The solid-state imaging device according to (12) or (13), in which the third photoelectric conversion portion corresponding to the dummy pixel is connected to an FD via a control transistor that is always on.

(15)

The solid-state imaging device according to any of (1) to (14), further including
a light shielding portion that shields the charge releasing portion and the OPB pixel from light.

(16)

The solid-state imaging device according to any of (1) to (15), which is of a back-illuminated type.

(17)

An electronic apparatus on which a solid-state imaging device is mounted, the solid-state imaging device having a first photoelectric conversion portion, an upper electrode, and a lower electrode formed outside a substrate, the first photoelectric conversion portion performing photoelectric conversion in accordance with incident light, the upper electrode and the lower electrode being formed to sandwich the first photoelectric conversion portion,
the solid-state imaging device including:
an aperture pixel that is disposed on a pixel array, and generates a normal pixel signal;
an OPB pixel that is disposed at an end portion on the pixel array, and generates a pixel signal indicating a dark current component; and
a charge releasing portion that is disposed between the aperture pixel and the OPB pixel, and releases electric charge flowing out from the aperture pixel.

REFERENCE SIGNS LIST

14 Si substrate
17 Wiring layer
19 Light shielding film
40 Solid-state imaging device
41 Aperture pixel
42 OPB pixel
43 Dummy pixel
51 Organic photoelectric conversion film
52 Upper electrode
53 Lower electrode
54 FD
55 Reset gate
60 Solid-state imaging device
61 Aperture pixel
62 OPB pixel
63 Dummy pixel
64 Connecting portion
70 Solid-state imaging device
71 Aperture pixel
72, 72' OPB pixel
73 Drain portion
74 Lower electrode
80 Solid-state imaging device
81 Aperture pixel
82 OPB pixel
83 Dummy pixel
84 PD
90 Solid-state imaging device
91 Aperture pixel
92 OPB pixel
93 Dummy pixel
94 PD
100 Solid-state imaging device
101 Aperture pixel
102 OPB pixel
103 Dummy pixel
105 FD
106 Transfer gate
120 Solid-state imaging device
121 Aperture pixel
122 OPB pixel
123 Dummy pixel
124 Connecting portion

The invention claimed is:

1. A solid-state imaging device, comprising:
a substrate that comprises a floating diffusion (FD);
a control transistor;
a first photoelectric conversion portion;
a second photoelectric conversion portion in the substrate,
wherein the first photoelectric conversion portion and the second photoelectric conversion portion are configured to perform photoelectric conversion based on incident light;
an upper electrode;
a lower electrode, wherein
the first photoelectric conversion portion, the upper electrode, and the lower electrode are outside the substrate, and
the upper electrode and the lower electrode sandwich the first photoelectric conversion portion;
an aperture pixel on a pixel array,
wherein the aperture pixel is configured to generate a normal pixel signal;
an optical black (OPB) pixel at an end portion of the pixel array,
wherein the OPB pixel is configured to generate a pixel signal indicating a dark current component; and
a charge releasing portion between the aperture pixel and the OPB pixel, wherein the charge releasing portion is configured to release electric charge that flows out from the aperture pixel, and the second photoelectric conversion portion corresponding to the charge releasing portion is connected to the FD via the control transistor.

2. The solid-state imaging device according to claim 1, wherein the charge releasing portion is a dummy pixel between the aperture pixel and the OPB pixel, and the lower electrode corresponding to the dummy pixel is at a constant voltage.

3. The solid-state imaging device according to claim 2, wherein the lower electrode corresponding to the dummy pixel is connected to a power supply voltage wiring line.

4. The solid-state imaging device according to claim 3, wherein the lower electrode corresponding to the dummy pixel is connected to the power supply voltage wiring line via the control transistor.

5. The solid-state imaging device according to claim 2, wherein at least two dummy pixels are between the aperture pixel and the OPB pixel.

6. The solid-state imaging device according to claim 2, wherein the aperture pixel is within a specific region, and the dummy pixel surrounds the specific region.

7. The solid-state imaging device according to claim 1, wherein the charge releasing portion includes the lower electrode that is at a constant voltage.

8. The solid-state imaging device according to claim 7, wherein the charge releasing portion is around the aperture pixel.

9. The solid-state imaging device according to claim 2, wherein the second photoelectric conversion portion has a different wavelength band for the photoelectric conversion from a wavelength band of the first photoelectric conversion portion.

10. The solid-state imaging device according to claim 9, wherein the second photoelectric conversion portion corresponding to the dummy pixel is connected to a power supply voltage wiring line.

11. The solid-state imaging device according to claim 2, further comprising a third photoelectric conversion portion in the substrate, wherein the third photoelectric conversion portion has a different wavelength band for the photoelectric conversion from wavelength bands of the first photoelectric conversion portion and the second photoelectric conversion portion.

12. The solid-state imaging device according to claim 11, wherein the third photoelectric conversion portion corresponding to the dummy pixel is connected to a power supply voltage wiring line.

13. The solid-state imaging device according to claim 11, wherein the third photoelectric conversion portion corresponding to the dummy pixel is connected to the FD via the control transistor.

14. The solid-state imaging device according to claim 2, further comprising a light shielding portion configured to shield the charge releasing portion and the OPB pixel from light.

15. The solid-state imaging device according to claim 2, wherein which is of the solid-state imaging device is a back-illuminated type.

16. An electronic apparatus, comprising:

a solid-state imaging device that comprises:

a substrate comprising a floating diffusion (FD);

a control transistor;

a first photoelectric conversion portion;

a second photoelectric conversion portion in the substrate, wherein the first photoelectric conversion portion and the second photoelectric conversion portion are configured to perform photoelectric conversion based on incident light;

an upper electrode;

a lower electrode, wherein the first photoelectric conversion portion, the upper electrode, and the lower electrode are outside the substrate, and the upper electrode and the lower electrode sandwich the first photoelectric conversion portion;

an aperture pixel on a pixel array, wherein the aperture pixel is configured to generate a normal pixel signal;

an optical black (OPB) pixel at an end portion of the pixel array, wherein the OPB pixel is configured to generate a pixel signal indicating a dark current component; and a charge releasing portion between the aperture pixel and the OPB pixel, wherein the charge releasing portion is configured to release electric charge that out from the aperture pixel, and the second photoelectric conversion portion corresponding to the charge releasing portion is connected to the FD via the control transistor.

* * * * *